United States Patent
Loibl et al.

(10) Patent No.: US 9,520,659 B2
(45) Date of Patent: Dec. 13, 2016

(54) CONNECTOR DEVICE FOR A PRINTED CIRCUIT BOARD OF A CONTROL DEVICE FOR A VEHICLE TRANSMISSION, CONTROL SYSTEM FOR A VEHICLE TRANSMISSION AND METHOD FOR ASSEMBLING A CONTROL SYSTEM FOR A VEHICLE TRANSMISSION

(71) Applicant: ZF FRIEDRICHSHAFEN AG, Friedrichshafen (DE)

(72) Inventors: Josef Loibl, Bad Abbach (DE); Herbert Wallner, Auerbach (DE); Roland Friedl, Auerbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 14/384,236

(22) PCT Filed: Feb. 1, 2013

(86) PCT No.: PCT/EP2013/051999
§ 371 (c)(1),
(2) Date: Sep. 10, 2014

(87) PCT Pub. No.: WO2013/135432
PCT Pub. Date: Sep. 19, 2013

(65) Prior Publication Data
US 2015/0077959 A1    Mar. 19, 2015

(30) Foreign Application Priority Data

Mar. 14, 2012  (DE) .................. 10 2012 204 002

(51) Int. Cl.
*H01R 24/00*    (2011.01)
*H01R 12/58*    (2011.01)
(Continued)

(52) U.S. Cl.
CPC ............. *H01R 12/58* (2013.01); *H01R 12/75* (2013.01); *H01R 13/5219* (2013.01);
(Continued)

(58) Field of Classification Search
CPC ......... H01R 12/53; H01R 12/58; H01R 12/75; H01R 13/5219
(Continued)

(56) References Cited

U.S. PATENT DOCUMENTS 3,590,348 A * 6/1971 Bertics ..................... H01G 2/06
361/308.1
3,671,917 A * 6/1972 Ammon ............... H01R 12/721
439/62
(Continued)

FOREIGN PATENT DOCUMENTS

DE     4237870 A1 *  3/1994   ......... B60R 16/0239
DE     4237870 A1 * 10/1994
(Continued)

OTHER PUBLICATIONS

International Search Report issued Apr. 9, 2013 in International Application No. PCT/EP2013/051999.
(Continued)

*Primary Examiner* — Tulsidas C Patel
*Assistant Examiner* — Peter G Leigh
(74) *Attorney, Agent, or Firm* — Brinks Gilson & Lione

(57) ABSTRACT

A proposal is made for a plug device for a circuit board of a control unit for a vehicle transmission. The circuit board has at least one contact hole. The plug device has a housing, at least one contact device arranged in the housing for a cable of a peripheral module fed into the housing and at least one contact plug that is electrically connected with the contact device and that protrudes at least partially from the
(Continued)

housing for producing an electrical and mechanical connection with the contact hole of the circuit board.

20 Claims, 6 Drawing Sheets

(51) Int. Cl.
    *H01R 12/75*     (2011.01)
    *H01R 13/52*     (2006.01)
    *H05K 5/00*     (2006.01)
    *H01R 24/28*     (2011.01)
    *H05K 7/10*     (2006.01)

(52) U.S. Cl.
    CPC ........... *H01R 24/28* (2013.01); *H05K 5/0069* (2013.01); *H05K 7/10* (2013.01); *H01R 2201/26* (2013.01)

(58) Field of Classification Search
    USPC .......................................... 439/629, 325, 55
    See application file for complete search history.

(56) References Cited

U.S. PATENT DOCUMENTS

| | | | | |
|---|---|---|---|---|
| 3,685,001 A * | 8/1972 | Krafthefer | ............ | H01R 13/111 439/377 |
| 3,696,323 A * | 10/1972 | Kinkaid | ............... | H05K 7/1038 439/525 |
| 3,710,299 A * | 1/1973 | Weisenburger | ........ | H05K 7/103 439/525 |
| 4,222,626 A * | 9/1980 | Hollyday | ........... | H01R 13/7197 333/182 |
| 4,274,699 A * | 6/1981 | Keim | ..................... | H01R 12/58 439/637 |
| 4,681,391 A * | 7/1987 | Bouley | ................ | H05K 7/1038 439/444 |
| 4,833,570 A * | 5/1989 | Teratani | ................. | H05K 3/284 174/138 G |
| 5,886,878 A * | 3/1999 | Khadem | ................ | H05K 3/306 174/138 G |
| 6,707,683 B1 * | 3/2004 | Bravek | .................. | H05K 3/306 174/261 |
| 6,790,051 B1 * | 9/2004 | Secall | .................... | H01R 9/091 174/260 |
| 7,048,594 B2 * | 5/2006 | Tsuchiya | .............. | H01R 12/585 439/751 |
| 7,248,901 B2 * | 7/2007 | Peiker | ................. | B60R 11/0241 455/569.1 |
| 8,610,528 B1 * | 12/2013 | Luzanov | ................ | H05K 1/141 336/192 |
| 8,632,346 B2 * | 1/2014 | Wittig | .................... | H01R 4/184 439/553 |
| 2004/0070857 A1 * | 4/2004 | Bonardi | ................ | B60Q 1/2665 359/871 |
| 2004/0131318 A1 * | 7/2004 | Mori | ..................... | G02B 6/4201 385/92 |
| 2009/0103324 A1 * | 4/2009 | Clavier | ................ | H05K 9/0064 362/546 |
| 2010/0151708 A1 * | 6/2010 | Pascut | .................. | H01R 13/424 439/76.2 |

FOREIGN PATENT DOCUMENTS

| | | |
|---|---|---|
| DE | 10 2010 034790 A1 | 2/2012 |
| WO | 93/12636 A1 | 6/1993 |
| WO | 2007/005111 A2 | 1/2007 |
| WO | 2009/103515 A2 | 8/2009 |

OTHER PUBLICATIONS

International Search Report and Written Opinion issued Apr. 9, 2013 in International Application No. PCT/EP2013/051999 (German language).

Office Action issued Nov. 15, 2012 in German Application No. 10 2012 204 002.1, including English translation of p. 5.

* cited by examiner

CONNECTOR DEVICE FOR A PRINTED CIRCUIT BOARD OF A CONTROL DEVICE FOR A VEHICLE TRANSMISSION, CONTROL SYSTEM FOR A VEHICLE TRANSMISSION AND METHOD FOR ASSEMBLING A CONTROL SYSTEM FOR A VEHICLE TRANSMISSION

This application is a filing under 35 U.S.C. §371 of International Patent Application PCT/EP2013/051999, filed Feb. 1, 2013, and claims the priority of DE 10 2012 204 002.1, filed Mar. 14, 2012. These applications are incorporated by reference herein in their entirety.

The present disclosure relates to a plug device for a circuit board of a control unit for a vehicle transmission, a control system for a vehicle transmission and a method for assembling a control system for a vehicle transmission.

A transmission control system for vehicle transmissions comprises a central electronic control unit by means of which additional control components, for example, sensors, valves or plugs can be connected with different vehicle systems. In electronics built on ceramic-based hybrid technology, specific sensors or actuators can be installed on metal pins, which are attached to an electronic control system (e-box), through laser beam welding of polyimide film, heavy strand bonding of film (flexible conductor) or laser beam welding of lead frames. A circuit board is used as a carrier for the electronic control unit.

DE 197 09 551 A1 discloses a circuit board and a method for connecting a circuit board. DE 10 2006 027 748 A1 discloses a circuit board and a method for producing a solderless electrical connection.

Against this background, the present disclosure provides, in accordance with the claims, an improved plug device for a circuit board of a control unit for a vehicle transmission, an improved control system for a vehicle transmission and an improved method for assembling a control system for a vehicle transmission. Advantageous embodiments are shown in the claims and the subsequent description.

According to embodiments of the present disclosure, cables or strands leading to peripheral devices or the like can be electrically or mechanically connected to a plug device, and the plug device can be electrically or mechanically connected to a circuit board by means of a plug connection. In particular, it is possible to connect a group or plurality of such cables to the circuit board by means of a single plug device.

Advantageously, according to embodiments of the present disclosure, it is especially possible to implement a modular construction of a transmission control system or modular system, wherein peripheral modules are connected to the circuit board by means of a uniform connection method. The method does not even require a mating plug that has to be soldered or pressed into the circuit board. As a result, it is possible to connect cables or strands to a circuit board in a safe, simple and cost-effective manner. The simple assembly or production method of plugging instead of soldering, welding or the like allows also for a detachable connection between circuit board and plug device, which is of advantage during repair or rework processes. Furthermore, the method provides high flexibility, especially with regard to different coefficients of expansion due to temperature, resulting in advantageous tolerance compensation. Therefore, it is possible to flexibly connect in an electrical and mechanical manner an electronic control system (e-box) as part of a mechatronic control module, especially within a transmission, to specific individual modules for sensors, actuators and plugs with strands or wires.

The present disclosure provides a plug device for a circuit board of a control unit for a vehicle transmission, wherein the circuit board has at least one contact hole, characterized in that the plug device has a housing and at least one contact device located in the housing for a cable of a peripheral module guided into the housing and at least one contact plug which is electrically connected to the contact device and protrudes at least partially from the housing in order to provide an electrical and mechanical connection with the contact hole of the circuit board.

The vehicle transmission can involve a direct shift gearbox or an automatic transmission. The vehicle transmission can be provided for a vehicle which involves a motor vehicle, for example, a passenger car or truck. In this connection, the control unit can assume a central function in the transmission control system. The circuit board can be part of the control unit. An electric circuit can be arranged on the circuit board. At the same time, the electric circuit can implement central control components to the transmission control system. For this purpose, electronic components are arranged in the component region of the circuit board. The circuit board can involve a printed circuit board with an electric circuit, conducting paths and connecting surfaces. The circuit board comprises an electrically insulating material with conductive connections in the form of conducting paths, through connections or circuit points. The circuit board can be manufactured from commonly used circuit board material. In addition, the circuit board can be manufactured from ceramic-based material. The at least one contact hole can be located in the edge strip of the circuit board. An edge strip can involve a longitudinal region along at least one edge of the circuit board. The at least one contact hole can be a metalized through-hole which extends from one main surface of the circuit board to the other main surface of the circuit board. The at least one contact hole can be electrically connected via a conducting path to the electric circuit on the circuit board. The cable can be in a form of a wire, a strand or a different electrical connecting cable. The at least one peripheral module can be a sensor component, an actuator component, for example, a valve component, or the like. The peripheral module can involve also a power supply or a communication system. The at least one peripheral module can be electrically contacted by means of the at least one cable via at least one electrical connection of the peripheral module. The housing of the plug device can consist of one or multiple pieces. The housing of the plug device is designed to accept the at least one contact device and part of the at least one contact plug. In this case, as well as in the subsequent description, the term "designed" can also mean "formed". When multiple cables are connected to multiple contact devices, each cable is respectively connected to a separate contact device. An individual cable can connect a single contact device of the plug device to a respective individual electrical connection of a peripheral module. An individual contact device can be electrically or mechanically connected to an individual contact plug. It is also possible to electrically connect an individual contact device to more than one contact plug. An individual contact plug can also be electrically connected to more than one individual contact device. The at least one contact plug can be designed to be inserted into or fed through a contact hole of the circuit board. At the same time, the contact plug can be connected in electrically conductive manner to the contact hole. As a result, the at least one contact plug is fed in the contact hole through the circuit board. Therefore, the length of the portion of the at least one contact plug protruding from the housing can be larger than the thickness of the circuit board. At the same time, the contact plug can be designed to fit properly into the circumference of a contact hole of the circuit board. In particular, the at least one contact plug can be designed to be kept in a contact hole of the circuit board by means of static friction.

According to an embodiment, a chip protection element that can be attached to the circuit board and additionally or alternatively to the housing of the plug device can be provided for covering an end portion of the contact plug that is at least partially protruding from the housing. The chip protection element can have a cover element, a cover plate, a cap or the like. The chip protection element can be designed to accept the end portion of the contact plug that is at least partially protruding from the housing. The end portion of the contact plug can be a free end of the contact plug, or an end of the contact plug facing away from the end received in the plug device. When the contact plug is designed to extend in the contact hole through the circuit board, thus having a portion that protrudes beyond the surface of the circuit board, it is possible by means of the chip protection element, for example, a simple plastic part, to provide that the at least one contact plug is protected against contamination and short circuits. The plastic cover or chip protection element can be connected to the circuit board by means of gluing, pressing, locking, hot caulking or screwing. The chip protection element can be designed to be connected in various ways to the circuit board and/or the plug device. At the same time, it is possible to seal the connection between the chip protection element and the circuit board and/or the plug device against fluids.

It is also possible to provide insulating agents which are arranged in the chip protection element. These insulating agents provide electric insulation of the end portion of the contact plug that is at least partially protruding from the housing. The insulating agents can be a casting compound, for example, SilGel or soft foam material, which is arranged in the chip protection element. The insulating agent can have at least one recess which is arranged at a position of the at least one end portion of the contact plug received in the chip protection element. The insulating agents can be designed to form a seal toward the circuit board. In this connection, the chip protection element can be manufactured from metal, for example, sheet metal or die-cast aluminum, in the form of a single component or an extension of an electronics base plate. Such an embodiment has the advantage that the at least one contact plug is provided with an additional protection against short circuits.

Furthermore, it is possible to provide a chip protection sealing component that is designed to form a seal between the chip protection element and a main surface of the circuit board about the end portion of the contact plug that is at least partially protruding from the housing. The chip protection sealing component comprises a sealing mat, a sealing ring or the like. In particular, the end portion of the contact plug extends from the main surface of the circuit board. Such an embodiment has the advantage that it is possible to provide a secure and reliable protection against contamination and the like for the at least one contact plug and the at least one contact hole.

It is also possible to provide a sealing component that is designed to form a seal about the at least one contact plug between a circuit board engaging surface of the housing of the plug device and a main surface of the circuit board. The sealing component comprises a sealing mat, a sealing ring or the like. At the same time, the sealing component can be implemented, for example, through injection or an inserted gasket, or by means of watertight adhesion or an appropriate casting compound. The main surface of the circuit board faces the housing of the plug device. The circuit board engaging surface of the housing of the plug device adjoins at least partially the main surface of the circuit board when the at least one contact plug is inserted in the at least one contact hole. Such an embodiment has the advantage that a secure and reliable protection against contamination and the like can be provided for the at least one contact plug and the at least one contact hole.

According to another embodiment, the plug device can have a plurality of contact plugs, which are arranged at least in one row protruding from a circuit board engaging surface of the housing of the plug device, and a plurality of contact devices. At the same time, the feeding direction for cables to the contact devices can be angular in relation to the extension direction of the contact plugs. In other words, the feeding direction for cables to the contact devices can be rectangular or transversal in relation to the extension direction of the contact plugs. The majority of contact plugs can be arranged in such a way that they protrude from the circuit board engaging surface of the housing of the plug device in a single row or multiple rows. At the same time, a connecting line of the at least one row of contact plugs can extend along a straight line. It is also possible that connecting lines of individual rows of contact holes extend parallel to one another. Such an embodiment has the advantage that the plug device can be connected to the circuit board in a simple, stable, secure and reliable manner. Depending on the specific application, it is also possible to configure a number of contact plugs combined in a plug device. In this way, it is possible to achieve excellent modularity.

In this context, the circuit board can have a plurality of contact holes which can be arranged in a single row or multiple rows next to one another along at least one lateral edge of the circuit board. In the process, connecting lines of the rows of contact holes arranged along a mutual and lateral edge can extend parallel to one another. Along a first lateral edge of the circuit board, a first plurality of contact holes can be arranged and, in another form, at least one further plurality of contact holes can be arranged along at least one further lateral edge of the circuit board. An individual contact hole is used for providing an electrical and mechanical connection with an individual contact plug. As a result, it is possible to connect a plurality of plug devices to the circuit board.

It is also possible to provide mounting devices for attaching the housing of the plug device to the circuit board. For example, the mounting devices can involve screws, threaded holes, adhesives, locking elements, rivets or the like. Such an embodiment has the advantage that the plug device can be securely and reliably connected to the circuit board. In addition, it is possible to prevent motion of the at least one contact plug in relation to the circuit board, for example, as a result of vibration stresses.

Furthermore, the present disclosure provides a control system for a vehicle transmission, wherein the control system has the following characteristics:

a control unit which has a circuit board with at least one contact hole;

at least one peripheral module with at least one cable; and at least one plug device of the type mentioned above, wherein the at least one peripheral module is connected via at least one cable to the at least one contact device of the plug device, wherein the at least one contact plug of the plug device is connected to the at least one contact hole of the circuit board of the control unit.

With the control system, it is possible to apply or use in an advantageous manner a circuit board of the type mentioned above.

Furthermore, as a sub-component of the control system, the present disclosure provides a peripheral module with at least a cable and at least a plug device of the type mentioned above, wherein the at least one cable is connected with the at least one contact device of the plug device. By means of the plug device, such a peripheral module can be connected quickly and easily with an appropriately molded circuit board of a control unit. In the same way, the peripheral module can be separated from the circuit board by detaching the plug device.

As a further sub-component of the control system, the present disclosure provides a control unit which has a circuit board with at least one contact hole and a plug device of the type mentioned above, wherein the at least one contact plug of the plug device is connected with the at least one contact hole of the circuit board of the control unit. The circuit board can have multiple groups of contact holes. Within a group the contact holes can be arranged in a row or in matrix format. Each group can represent a contacting possibility for a contact plug. As a result, multiple peripheral modules, for example, can be connected with the circuit board. The control unit can have a housing, which is arranged on the circuit board, to seal an electric circuit of the control unit, for example, an integrated circuit, watertight toward the surrounding area of the control unit. The at least one contact plug can be arranged in an area of the circuit board outside of the housing.

Furthermore, the present disclosure provides a method for assembling a control system of a vehicle transmission, wherein the method comprises the following steps:

providing the control unit with a circuit board that has at least one contact hole;

providing a plug device of the type mentioned above which is connected with at least one cable of the at least one peripheral module; and inserting the at least one contact plug of the plug device in the at least one contact hole of the circuit board.

By implementing the method, it is possible to assemble in an advantageous manner the control system of the type mentioned above. The step of providing the plug device, with which the at least one cable of the at least one peripheral module is connected, can involve also several sub-steps. A sub-step can involve the preparation of the at least one cable, wherein a wire end or strand end of the cable is cut to length and/or stripped. One sub-step can also involve connecting the at least one prepared cable to the at least one contact device. At the same time, the at least one contact device can have an end portion of a straight or angular contact plug. During the step of connecting, it is possible to produce an electrical and a mechanical connection, for example, by means of crimping, welding, soldering or the like. Furthermore, a sub-step of arranging the at least one contact device with which the cable is connected and the at least one contact plug can be performed in the housing of the plug device. In the process, the at least one contact device with which the cable is connected and the at least one contact plug can be fixed in a defined position, for example, by means of the housing in the form of a one-piece or two-piece plastic component. During the step of inserting, the plug device, with which at least one cable of the at least one peripheral module is connected, can be mechanically and electrically connected with the at least one contact hole.

Provision can also be made for a step of assembling the plug device at the circuit board. The step of assembling can be performed with mounting devices and/or processes, such as screwing, gluing, pressing, locking, riveting or hot caulking.

According to an embodiment, the at least one plug device can be aligned in relation to the circuit board by using an alignment device. In the process, it is possible to correctly position the at least one plug device in relation to the circuit board of the control unit. Therefore, the alignment device can be designed to align at least one plug device in relation to the circuit board. Such an embodiment has the advantage of facilitating the process of inserting the at least one contact plug of the plug device in the at least one contact hole of the circuit board. Manual alignment is not required. As a result, the process of inserting can be performed more precisely.

Provision can also be made for sealing a circuit board engaging surface of the housing of the plug device and a main surface of the circuit board about the at least one contact plug. Additionally and alternatively, it is possible to provide a step of covering an end portion of the contact plug which protrudes at least partially from the housing. The covering process can be performed by means of at least one of the above-mentioned sealing components. The covering process can be performed by means of the above-mentioned chip protection element, chip protection sealing component and/or the above-mentioned insulating agents. Such an embodiment has the advantage that it is possible to provide a secure and reliably protection against contamination and the like for the at least one contact plug and the at least one contact hole.

The present disclosure is explained in more detail in an exemplary manner by means of the enclosed drawings. It is shown:

In the following description of embodiments of the present disclosure, the same or similar numerals are used for the similarly acting elements shown in the different figures, wherein it is avoided to repeat the description of these elements.

Figure 1:
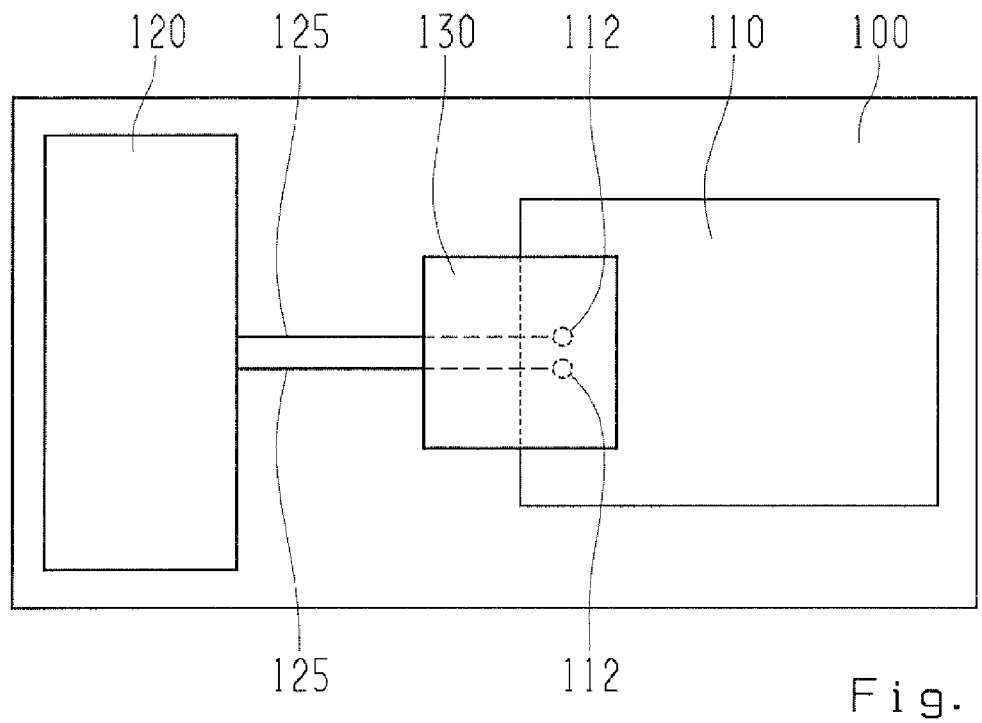
FIG. 1 is a control system with a plug device according to an embodiment of the present disclosure.

FIG. 1 shows a control system 100 with a plug device according to an embodiment of the present disclosure. The control system 100 has a circuit board 110 with exemplary two contact holes 112, exemplary a peripheral module 120, exemplary two cables 125 and exemplary a plug device 130 or plug module. The cables 125 represent electrical lines, for example, strands. Different from FIG. 1, the circuit board 110 can have a different number of contact holes 112, peripheral modules 120, cables 125 and/or plug devices 130. The control system 100 can be part of a transmission control system of a vehicle. The circuit board 110 can be part of a control unit of the control system 100. Subsequently, the plug device 130 is described in more detail with reference to FIGS. 2A to 6C.

By means of the cables 125, the peripheral module 120 is connected to the plug device 130. In particular, the peripheral module 120 is electrically and mechanically connected to the plug device 130 by means of the cables 125. The plug device 130 is connected to the circuit board 110. In particular, the plug device 130 is electrically and mechanically connected to the circuit board 110. At the same time, the plug device 130 is electrically and mechanically connected to, especially inserted in, the contact holes 112 of the circuit board 110. As a result, by means of the plug device 130, an electrical connection, especially an electrical circuit in the form of electric or electronic components of the circuit board 110, is provided between the circuit board 110 and the peripheral module 120. The peripheral module 120 is electrically connected to the circuit board 110 via the cables 125 by means of the plug device 130 and via the contact holes 112. In the process, by means of the plug device 130, a first cable 125 is electrically connected to a first contact hole 112. By means of the plug device 130, a second cable 125 is electrically connected to a second contact hole 112.

Figure 2A:
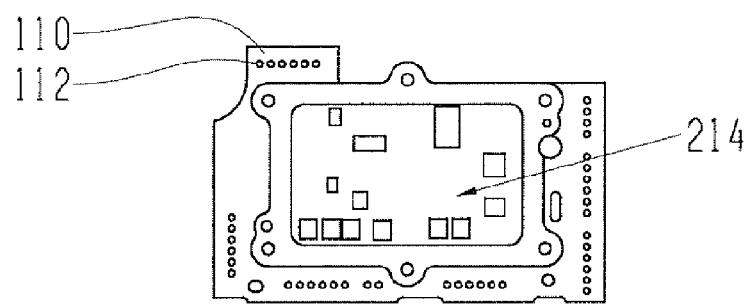
FIGS. 2A to 2D are a circuit board with and without plug devices according to embodiments of the present disclosure.

FIG. 2A shows a circuit board 110. The circuit board 110 can involve the circuit board 110 shown in FIG. 1. The circuit board 110 can be part of a control unit. The circuit board 110 has a rectangular layout with recesses and protrusions. The circuit board 110 has a plurality of contact holes 112. The contact holes 112 can involve metalized through-holes. According to the embodiment shown in FIG. 2A of the present disclosure, the circuit board 110 has contact holes on all four sides of the rectangular layout of the circuit board 110. At the same time, the contact holes 112 extend at least partially along a length of the respective lateral edges of the circuit board 110 in an edge strip of the circuit board 110. In particular, the contact holes 112 extend in a row at least partially along a length of the respective lateral edges. For example, the contact holes 112 can extend along a total length of a lateral edge or along half or one third of a lateral edge. The contact holes 112 can also be arranged in groups of contact holes 112. At the same time, a distance between contact holes 112 within a group can be smaller or equal to a distance between adjacent groups of contact holes 112 along a mutual lateral edge of the circuit board. For reasons of clarity, only one of the contact holes 112 has been provided with a reference numeral.

Furthermore, FIG. 2A shows a component region 214. A plurality of passive and/or active electrical components is arranged in the component region 214 of the circuit board 110. In particular, the circuit board 110 and the plurality of electrical components can form the control unit or an ECJ (electronic control unit) of a vehicle transmission.

Figure 2B:
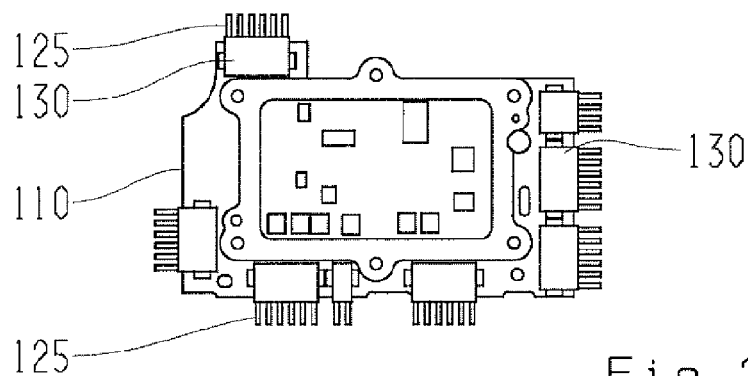

FIG. 2B depicts the circuit board 110 shown in FIG. 2A with plug devices or plug modules according to embodiments of the present disclosure. A plurality of cables 125 and exemplary eight plug devices 130 are shown. For example, a number of cables 125 can correspond to a number of contact holes of the circuit board 110. The cables 125 can represent the transfer of strands to peripheral modules, for example, sensors. The cables 125 are connected to the plug devices 130. The plug devices 130 are connected to the circuit board 110. In particular, the plug devices 130 are connected to the contact holes of the circuit board 110. At the same time, an individual plug device 130 is connected to an individual group of the plurality of contact holes 112. In FIG. 2B, the contact holes of the circuit board 110 are covered by the plug devices 130. The plurality of electrical components in the components region of the circuit board 110 can be electrically connected to peripheral modules via the plurality of contact holes, by means of plug devices, and via the plurality of cables 125.

Figure 2C:
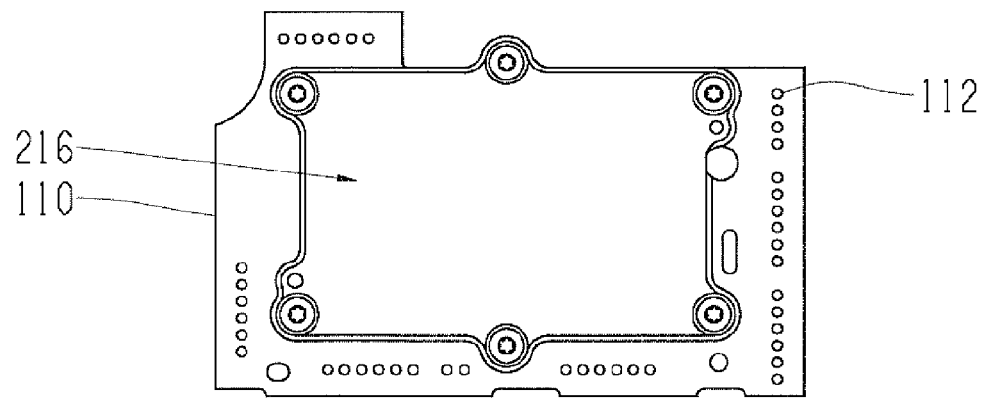

FIG. 2C shows the circuit board 110 shown in FIG. 2A with an electronics housing 216. The electronics housing 216 is arranged with a covering function in the component region of the circuit board 110. Apart from that, the circuit board 110 shown in FIG. 2C corresponds to the one shown in FIG. 2A.

Figure 2D:
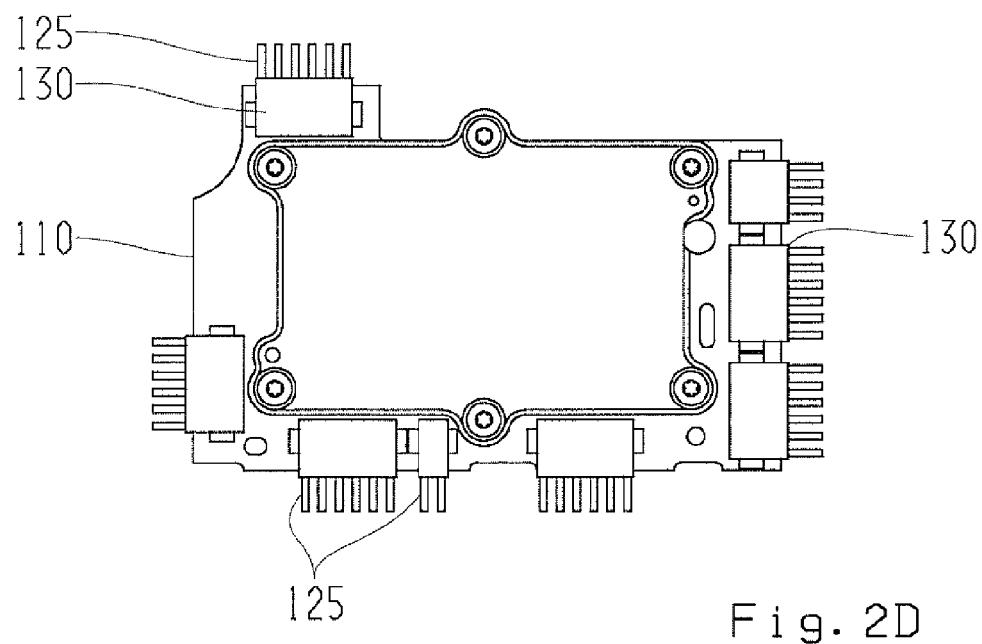

FIG. 2D depicts the circuit board 110 shown in FIG. 2C with plug devices 130 according to the embodiments of the present disclosure. Consequently, the representation of FIG. 2D results from a combination of FIGS. 2B and 2C.

Figure 3:
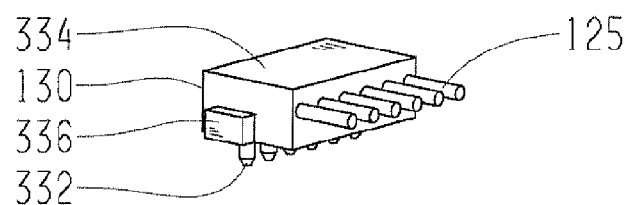
FIG. 3 is a plug device according to an embodiment of the present disclosure.

FIG. 3 shows a plug device according to an embodiment of the present disclosure. The plug device can involve the plug device shown in FIG. 1. In an exemplary manner, six cables 125 are shown which are connected to the plug device 130. The cables 125 can be attached with a peripheral module or multiple peripheral modules. According to the embodiment shown in FIG. 3, the plug device 130 has exemplary six contact plugs 332, a housing 334 or a cover, as well as mounting devices 336. The housing 334 of the plug device 130 has a cube-shaped design. According to the embodiment shown in FIG. 3 of the present disclosure, the mounting devices 336 are formed as protrusions on two surfaces on the narrow sides of the housing 334 facing away from one another. However, in the picture of FIG. 3, only one mounting device 336 is visible. According to the embodiment shown in FIG. 3 of the present disclosure, the mounting devices 336 can involve screws, rivets or the like. The cables 125 are fed into the housing on an insertion surface, which represents a long sidewall surface of the housing 334.

Although not visible in FIG. 3, exemplary six contact devices are arranged in the housing 334 for the exemplary six cables 125 fed into the housing 334. The cables 125 are electrically and mechanically connected to the contact devices. The contact devices are electrically connected to the contact plugs 332. At the same time, one of the contact devices, respectively, can be electrically connected to the respective contact plug 332. On a circuit board engaging surface, the contact plugs 332 protrude at least partially from the housing 334. The circuit board engaging surface adjoins the insertion surface of the housing 334. According to the embodiment shown in FIG. 3 of the present disclosure, a feeding direction of the cables 125 to the contact devices is rectangular in relation to an extension direction of the contact plugs 332. The contact plugs 332 are designed to produce by means of an insertion in the contact holes of the circuit board, such as the circuit board shown in FIGS. 1 to 2D, an electrical and mechanical connection to the circuit board.

Figure 4A:
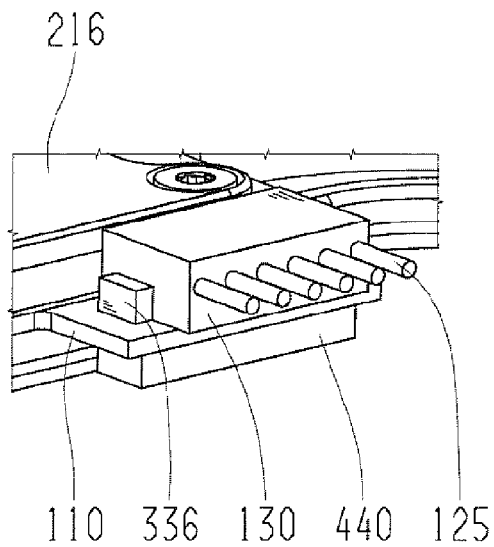
FIGS. 4A to 4D are a circuit board with the plug device shown in FIG. 3.

FIG. 4A shows a circuit board with the plug device shown in FIG. 3. The figure shows the circuit board 110, which can involve the circuit board shown in FIGS. 1 to 2D, exemplary six cables 125, which are connected to the plug device 130, as well as the electronics housing 216. The cables 125 can be attached to a peripheral module or multiple peripheral modules. In this case, the plug device 130 corresponds to the plug device shown in FIG. 3, with the exception that additionally a chip protection element 440 is shown. The plug device 130 is inserted in contact holes of the circuit board 110. The plug device 130 is attached to a first main surface of the circuit board 110. The chip protection element 440 is arranged on a second main surface of the circuit board 110 facing away from the first main surface of the circuit board 110. The chip protection element 440 is designed to cover end portions of the contact plugs which are inserted through the contact holes of the circuit board 110 and which protrude at least partially from the housing of the plug device 130. As a result, the contact plugs of the plug device shown in FIG. 4A are covered by the chip protection element 440. The chip protection element 440 can be attached on the end portions of the contact plugs fed through the contact holes of the circuit board 110 and protruding at least partially from the housing plug device 130.

Figure 4B:
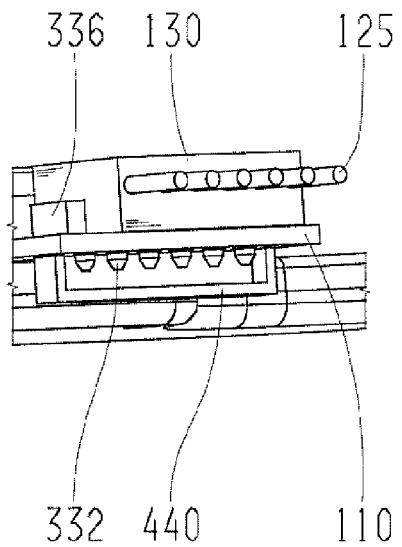

FIG. 4B shows the circuit board 110 with the plug device 130 shown in FIG. 4A. The depiction shown in FIG. 4B corresponds to the depiction shown in FIG. 4A, wherein the circuit board 110 and the plug device 130 of FIG. 4B are shown in a different perspective than in FIG. 4A. As a result, the electronics housing 216 of the circuit board is not visible. Furthermore, in FIG. 4B the chip protection element 440 is shown to be partially cut away to make the contact plugs 332 received in the chip protection element 440 visible.

Figure 4C:
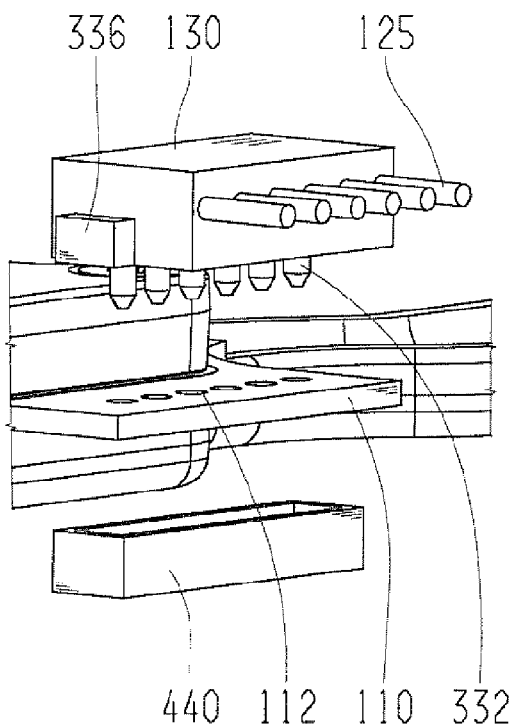

FIG. 4C shows the circuit board 110 with the plug device 130 shown in FIG. 4A or FIG. 4B. The depiction of FIG. 4C corresponds to the depiction of FIG. 4A or FIG. 4B, with the exception that the plug device 130 is not attached to the circuit board 110. In FIG. 4C, the plug device 130 is aligned with the exemplary six contact holes 112 of the circuit board 110 and spaced from the circuit board 110. The chip protection element 440 is also shown spaced from the circuit board 110. As a result, FIG. 4C shows the circuit board 110 with the plug device 130 shown in FIG. 4A or FIG. 4B in a partially exploded view.

Figure 4D:
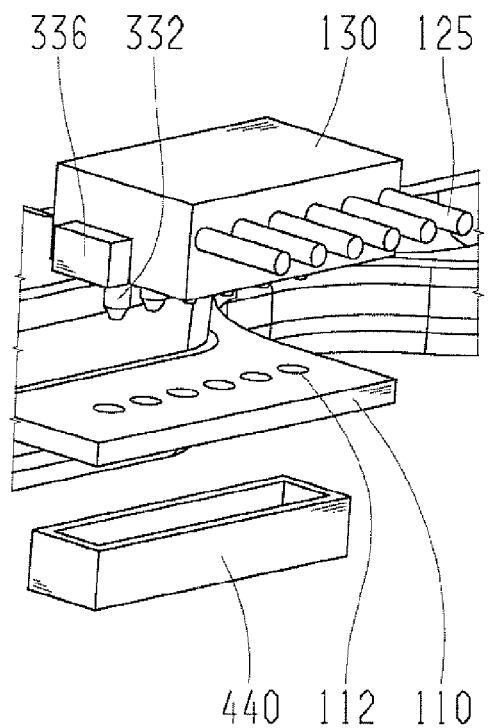

FIG. 4D shows the circuit board 110 with the plug device 130 shown in FIG. 4A, FIG. 4B or FIG. 4C. Similar to FIG. 4C, FIG. 4D shows the circuit board 110 with the plug device 110 in a partially exploded view, but from a different perspective than FIG. 4C.

Figure 5A:
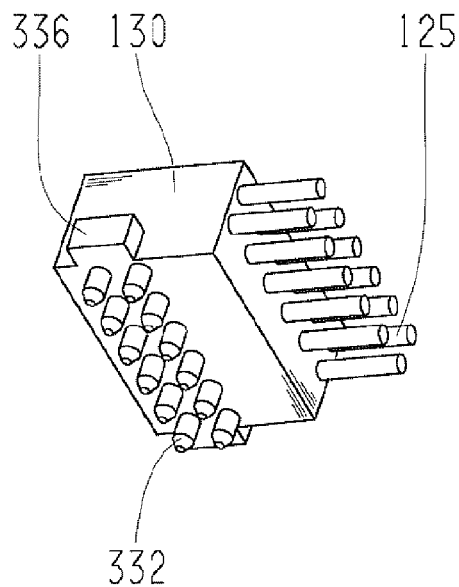
FIGS. 5A to 5D are plug devices according to embodiments of the present disclosure.

FIG. 5A shows the plug device 130 according to a further embodiment of the present disclosure. The plug device 130 corresponds to the plug device shown in FIG. 3, with the exception that exemplary twelve cables 125 are connected to the plug device 130, instead of six, in accordance with the embodiment shown in FIG. 5A of the present disclosure, and that the plug device 130 has exemplary twelve contact plugs 332 instead of six. On the insertion surface, the cables 125 are fed in two rows into the plug device 130. The contact plugs 332 are arranged in two rows protruding from the circuit board engaging surface of the housing of the plug device 130. At the same time, a first connecting line of a first row of contact plugs extends along a straight line. In addition, a second connecting line of a second row of contact plugs extends along a straight line. The first connecting line and the second connecting line can extend parallel to one another. Although not visible in FIG. 5A, in the housing exemplary twelve contact devices are arranged for the exemplary twelve cables 125 inserted into the housing. The cables 125 are electrically and mechanically connected to the contact devices. The contact devices are electrically connected to the contact plugs 332. At the same time, one of the contact devices, respectively, can be electrically connected with one of the respective contact plug 332.

Figure 5B:
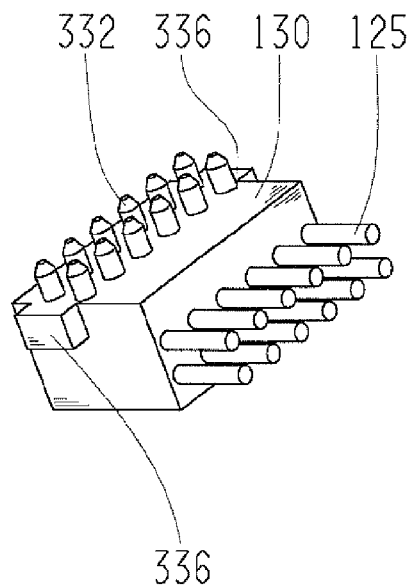

FIG. 5B shows the plug device from FIG. 5A from a different perspective. Both mounting devices 336 of the plug device are visible.

Figure 5C:
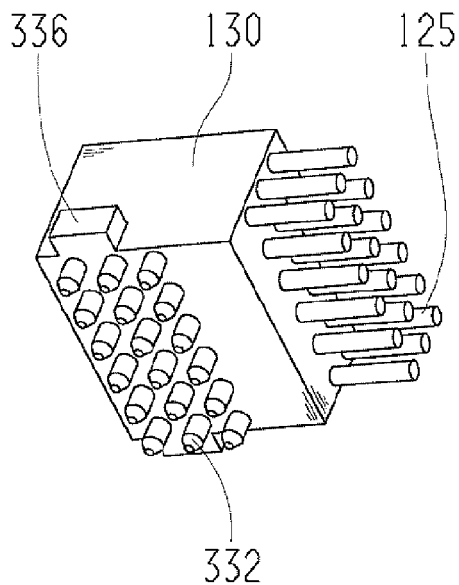

FIG. 5C shows a plug device 130 according to a further embodiment of the present disclosure. The plug device 130 corresponds to the plug device shown in FIG. 3 or FIG. 5A, with the exception that exemplary cables 125 are connected to the plug device 130 according to the embodiment shown in FIG. 5C of the present disclosure and that the plug device 130 has eighteen exemplary contact plugs 332. On the insertion surface, the cables 125 are fed in three rows into the plug device 130. The contact plugs 332 are arranged in three rows protruding from the circuit board engaging surface of the housing of the plug device 130. At the same time, a first connecting line of a first row of contact plugs extends along a straight line. In addition, a second connecting line of a second row of contact plugs extends along a straight line. Furthermore, a third connecting line of a third row of contact plugs extends along a straight line. The first connecting line, the second connecting line and the third connecting line can extend parallel to one another. Although not visible in FIG. 5C, in the housing eighteen exemplary contact devices are arranged for the exemplary cables 125 inserted into the housing. The cables 125 are electrically and mechanically connected to the contact devices. The contact devices are electrically connected to the contact plugs 332. At the same time, one of the contact devices, respectively, can be electrically connected to one of the respective contact plug 332.

Figure 5D:
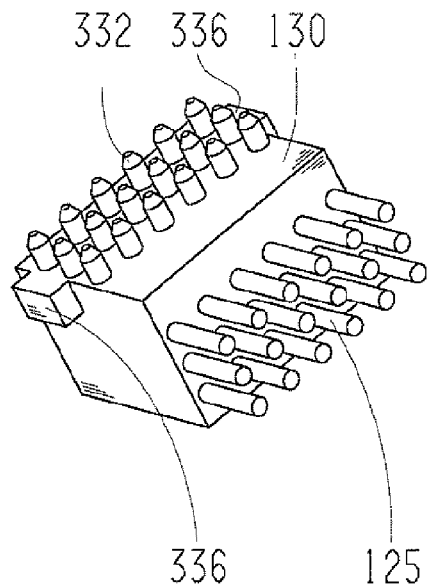

FIG. 5D shows the plug device from FIG. 5C from a different perspective. Both mounting devices 336 of the plug device are visible.

Figure 6A:
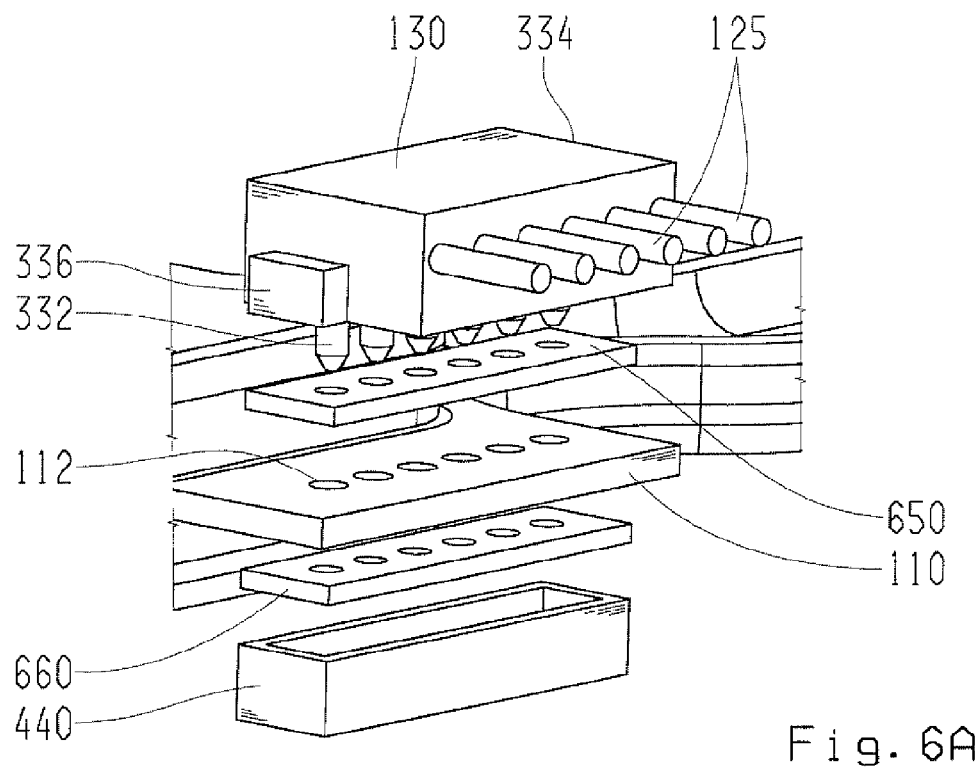
FIGS. 6A to 6C are a circuit board with the plug device shown in FIG. 3.

FIG. 6A shows a circuit board 110 with a plug device 130 according to a further embodiment of the present disclosure. The depiction in FIG. 6A corresponds to the depiction in FIG. 4C, with the exception that additionally a sealing component 650 or a sealing mat is shown between the plug device 130 and the circuit board 110, as well as a chip protection sealing component 660 or a further sealing mat is shown between the circuit board 110 and the chip protection element 440. The sealing component 650 has exemplary six through-holes with dimensions and spaces that correspond to the contact holes 112 of the circuit board 110. The through-holes of the sealing component 650 are designed to allow for an insertion of the contact plugs 332 of the plug device 130. The chip protection sealing component 660 has exemplary six through-holes with dimensions and spaces that correspond to the contact holes 112 of the circuit board 110. The through-holes of the chip protection sealing component 660 are designed to allow for the contact plugs 332 of the plug device 130 to be pushed through.

Figure 6B:
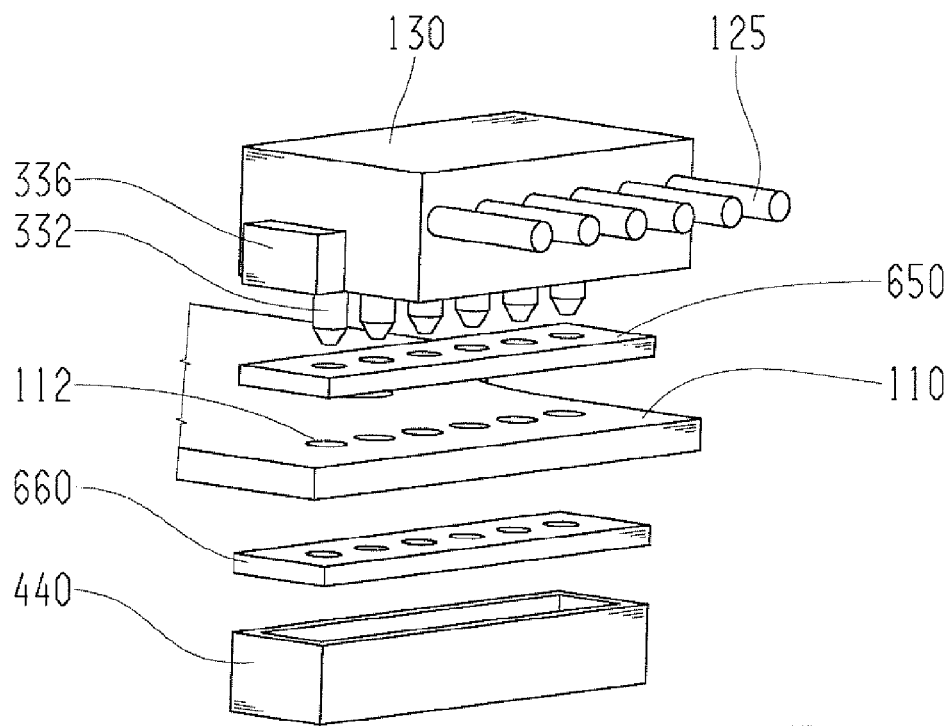

FIG. 6B shows the circuit board with the plug device from FIG. 6A from a different perspective. Apart from that, the depiction corresponds to that shown in FIG. 6A.

Figure 6C:
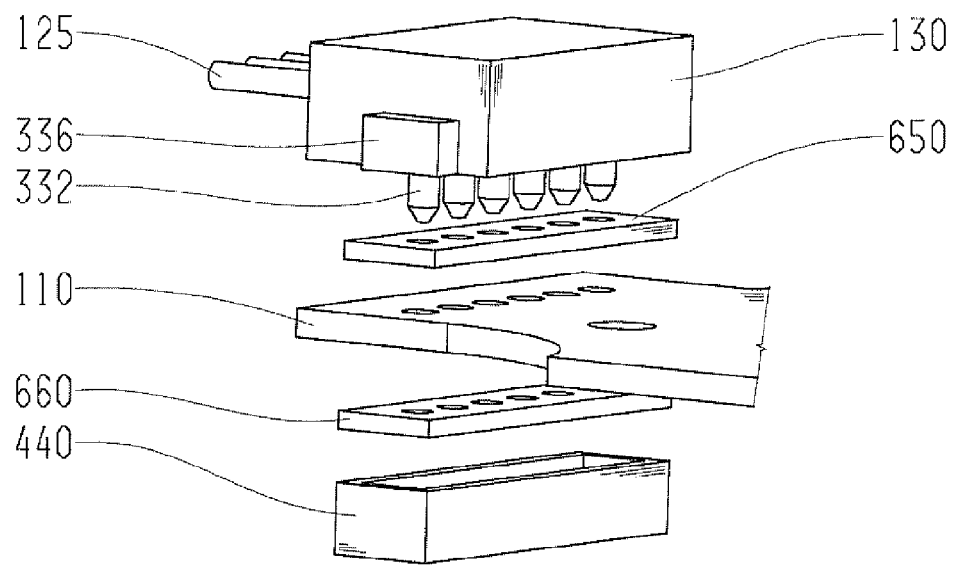

FIG. 6C shows the circuit board with the plug device from FIG. 6A or FIG. 6B from a different perspective. Apart from that, the depiction corresponds to that shown in FIG. 6A.

Figure 7:
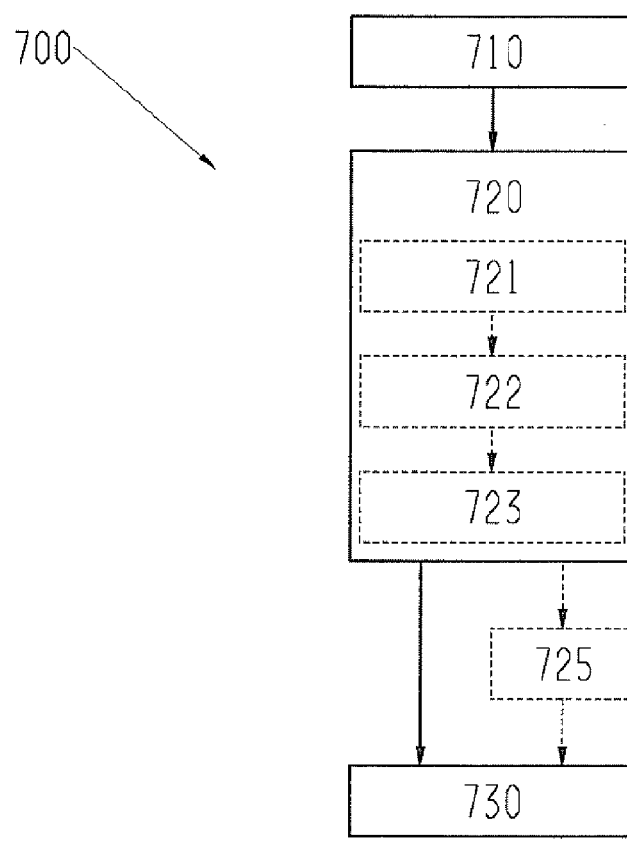
FIG. 7 is a flow chart of a method according to an embodiment of the present disclosure.

FIG. 7 shows a flow chart of a method 700 for assembling a control system, especially for a vehicle transmission, according to an embodiment of the present disclosure. The method involves a step of providing 710 a control unit with a circuit board which has at least one contact hole. The method 700 involves also a step of providing 720 a plug device by means of which at least one cable is connected to at least one peripheral module. The plug device has a housing and at least one contact device arranged in the housing for the cable of the peripheral module fed into the housing and at least one contact plug that is electrically connected to the contact device and that protrudes at least partially from the housing for producing an electrical and mechanical connection with the contact hole of the circuit board.

The step of providing 720 the plug device, with which the at least one cable of the at least one peripheral module is connected, can involve also several optional sub-steps. A sub-step can involve the preparation 721 of the at least one cable, wherein a wire end or strand end of the cable is cut to length and/or stripped. One sub-step can also involve connecting 722 the at least one prepared cable to the at least one contact device. Furthermore, a sub-step can involve arranging 723 the at least one contact device with which the cable is connected and the at least one contact plug in the housing of the plug device.

In addition, the method 700 may involve a step of aligning 725 the at least one plug device in relation to the circuit board by using an alignment device. Furthermore, the method 700 involves a step of inserting 730 the at least one contact plug of the plug device into the at least one contact hole of the circuit board.

Although not shown in FIG. 7, the method 700 can involve also a step of sealing a circuit board engaging surface of the housing of the plug device and a main surface of the circuit board about the at least one contact plug and/or a step of covering an end portion of the contact plug protruding at least partially from the housing. Provision can also be made for assembling the plug device at the circuit board. By performing the method 700, a control system can be assembled, as shown and described in FIG. 1.

Subsequently, different embodiments of the present disclosure are summarized with reference to FIGS. 1 to 7. According to embodiments of the present disclosure, the plug device is able to provide a direct plug connection of peripheral modules 120 to a circuit board 110.

According to an embodiment of the present disclosure, wire or strand ends of the cables 125 of peripheral modules 120 or sensor, actuator and/or plug modules are cut to length, stripped and, for example, crimped, welded or soldered together at one end of straight or angular contact plugs 332 of the plug device. Subsequently, the contact plugs 332 are fixed in a definite position, for example, by means of a housing in the form of a one-piece or two-piece plastic component. By means of an alignment device, plug devices 130 prepared in this way are now correctly positioned in relation to the circuit board 100 of the electronics unit of the control system 100, and contact zones of the contact plugs 332 are directly inserted in the metalized contact holes 112 in the circuit board 110.

After feeding the contact plugs 332 of the plug device 130 through the circuit board 110, they can have a projection in relation to the circuit bard 110. Therefore, according to an embodiment of the present disclosure, protection against contamination and short circuits is provided by means of appropriate measures, for example, a chip protection element 440 in the form of a simple plastic part, a chip protection sealing component 660 and/or insulating agents. The chip protection element 440 can be connected with the circuit board 110 by means of gluing, pressing, locking, hot caulking or screwing. This chip protection can be connected in various ways with the circuit board 110 or with the plug device 130 or plug module. At the same time, it is possible to seal the connection against fluids, for example, by integrating the chip protection sealing component 660.

A further possibility of implementing a protection against short circuits between individual pin-ends of the contact plugs 332 in accordance with an embodiment of the present disclosure involves that insulating agents, for example, in the form of a casting compound, such as SilGel or soft foam material with recesses at the contact plug positions and sealing closure toward the circuit board, are inserted in the chip protection element 440 or chip protection cover. In this embodiment, the chip protection element 440 can also be manufactured from metal, for example, sheet metal or die-cast aluminum, in the form of a single component or an extension of an electronics base plate.

According to an embodiment of the present disclosure, with appropriate measures the plug device 130 can be firmly connected with the circuit board 110 to prevent motions of the contact plugs 332 in relation to the circuit board 110, for example, as a result of vibration stresses. This can be achieved by means of screwing, gluing, pressing, locking, riveting or hot caulking.

According to an embodiment of the present disclosure, if required a construction plane of the circuit board 110 can be tightly sealed toward the chip protection element 440 and plug device 130, for example, by means of injection molding, by inserting a molded seal, by watertight adhesion or by means of an appropriate casting compound.

According to embodiments of the present disclosure, depending on the specific application, it is possible to fix a number of contact plugs 332 combined in a plug device 130 according to request. This can be done in a single row or multiple rows.

The embodiments described and shown in the figures are to be viewed only as examples. Different embodiments may be combined in full or in relation to individual characteristics. In addition, an embodiment may be supplemented by the characteristics of another embodiment.

REFERENCE NUMERALS 100 control system
110 circuit board
112 contact hole
125 cable
130 plug device
214 component region
216 electronics housing
332 contact plug
334 housing of the plug device
336 mounting device
440 chip protection element
650 sealing component
660 chip protection sealing component
700 method for assembling a control system
710 first step of providing a control unit with a circuit board
720 second step of providing a plug device
721 step of preparing at least one cable
722 step of connecting at least one prepared cable
723 step of arranging at least one contact device
725 step of aligning at least one plug device
730 step of inserting at least one contact plug

The invention claimed is:

1. A plug device for a circuit board of a control unit for a vehicle transmission, wherein the circuit board comprises at least one contact hole, the plug device comprising:
   a housing;
   at least one contact device arranged in the housing for a cable of a peripheral module fed into the housing;
   at least one contact plug which is electrically connected to the at least one contact device and protrudes at least partially from the housing, the at least one contact plug configured to provide a detachable electrical and mechanical connection to the at least one contact hole of the circuit board; and
   a sealing component, wherein the sealing component forms a seal about the at least one contact plug between a circuit board engaging surface of the housing of the plug device and a main surface of the circuit board.

2. The plug device according to claim 1, further comprising a chip protection element wherein the chip protection element is attached on at least one of the circuit board and the housing of the plug device, the chip protection element configured to cover an end portion of the at least one contact plug that is at least partially protruding from the housing.

3. The plug device according to claim 2, further comprising an insulating agent, wherein the insulating agent is arranged in the chip protection element, the insulating agent configured to provide electric insulation of the end portion of the at least one contact plug that is at least partially protruding from the housing.

4. The plug device according claim 2, further comprising a chip protection sealing component, wherein the chip protection sealing component forms a seal between the chip protection element and a main surface of the circuit board about the end portion of the at least one contact plug that is at least partially protruding from the housing.

5. The plug device according claim 1, wherein the sealing component comprises at least one through-hole configured to receive the at least one contact plug.

6. The plug device according to claim 1, wherein the plug device has a plurality of contact plugs which are arranged at least in one row protruding from a circuit board engaging surface of the housing of the plug device, and a plurality of contact devices, wherein at least one cable of at least one peripheral module; and
inserting the at least one contact plug of the plug device in the at least one contact hole of the circuit board.

7. A control system for a vehicle transmission, the control system comprising:
a control unit comprising a circuit board with at least one contact hole;
at least one peripheral module with at least one cable; and
at least one plug device in accordance with claim 1, wherein the at least one peripheral module is connected via the at least one cable to the at least one contact device of the plug device, wherein the at least one contact plug of the plug device is connected to the at least one contact hole of the circuit board of the control unit.

8. A method for assembling a control system of a vehicle transmission, the method comprising the following steps:
providing a control unit with a circuit board that has at least one contact hole;
providing the plug device in accordance with claim 1, the plug device connected to at least one cable of at least one peripheral module; and
inserting the at least one contact plug of the plug device in the at least one contact hole of the circuit board to detachably connect the at least one contact plug to the at least one contact hole.

9. The method according to claim 8, further comprising a step of aligning the plug device in relation to the circuit board by using an alignment device.

10. The method according to claim 8, further comprising a step of sealing a circuit board engaging surface of the housing of the plug device and a main surface of the circuit board about the at least one contact plug.

11. The method according to claim 10, wherein the method comprises a step of covering an end portion of the contact plug protruding at least partially from the housing.

12. The plug device according to claim 6, wherein the plug device comprises a mounting device formed on a narrow side of the housing which is perpendicular to the circuit board engaging surface of the housing.

13. The plug device according to claim 6, wherein the circuit board engaging surface of the housing adjoins an insertion surface of the housing on which the cable of the peripheral module is received.

14. A control system for a vehicle transmission, comprising:
a circuit board with a plurality of contact holes;
at least one peripheral module with a plurality of cables; and
at least one plug device comprising:
a housing;
a plurality of contact devices arranged in the housing for the plurality of cables fed into the housing;
a plurality of contact plugs electrically connected to the contact devices, the contact plugs extending from the housing in a different direction than a feeding direction of the plurality of cables fed into the housing; and
a sealing component, wherein the sealing component forms a seal about at least one of the contact plugs between a circuit board engaging surface of the housing of the plug device and a main surface of the circuit board,
wherein the at least one peripheral module is connected via the plurality of cables to the plurality of contact devices of the plug device, and the plurality of contact plugs are connected by static friction to the plurality of contact holes of the circuit board.

15. The control system according to claim 14, wherein the plurality of contact holes are arranged at least partially along a length of respective lateral edges of the circuit board.

16. The control system according to claim 14, wherein the plurality of contact holes are metalized through-holes.

17. The control system according to claim 14, wherein the plurality of contact plugs are inserted in the plurality of contact holes of the circuit board such that the plurality of contact plugs is configured to provide an electrical and mechanical connection between the plug device and the circuit board.

18. The control system according to claim 14, wherein the plurality of cables are fed in at least two rows into the plug device.

19. The control system according to claim 18, wherein the at least two rows are parallel to one another, and a line of at least one of the two rows is a straight line.

20. A control system for a vehicle transmission, comprising:
a circuit board with a plurality of contact holes;
at least one peripheral module with a plurality of cables; and
at least one plug device comprising:
a housing;
a plurality of contact devices arranged in the housing for the plurality of cables fed into the housing;
a plurality of contact plugs electrically connected to the contact devices, the contact plugs extending from the housing;
a chip protection element attached to the circuit board; and
a sealing component, wherein the sealing component forms a seal about at least one of the contact plugs between a circuit board engaging surface of the housing of the plug device and a main surface of the circuit board,
wherein the at least one peripheral module is connected via the cables to the contact devices of the plug device, and the plurality of contact plugs are detachably connected to the plurality of contact holes of the circuit board, and wherein the circuit board is sealed toward the chip protection element and the plug device by at least one of a molded seal, watertight adhesion and casting compound.

* * * * *